United States Patent
Dudley

(10) Patent No.: US 9,431,928 B2
(45) Date of Patent: Aug. 30, 2016

(54) POWER PRODUCTION IN A COMPLETED WELL USING MAGNETOSTRICTIVE MATERIALS

(71) Applicant: Oscilla Power, Inc., Seattle, WA (US)

(72) Inventor: James H Dudley, Spring, TX (US)

(73) Assignee: Oscilla Power Inc., Seattle, WA (US)

( * ) Notice: Subject to any disclaimer, the term of this patent is extended or adjusted under 35 U.S.C. 154(b) by 0 days.

(21) Appl. No.: 14/535,248

(22) Filed: Nov. 6, 2014

(65) Prior Publication Data
US 2015/0123405 A1 May 7, 2015

Related U.S. Application Data

(60) Provisional application No. 61/900,679, filed on Nov. 6, 2013.

(51) Int. Cl.
*H02N 2/18* (2006.01)
*H01L 41/12* (2006.01)
*E21B 41/00* (2006.01)
*E21B 43/12* (2006.01)

(52) U.S. Cl.
CPC .............. *H02N 2/18* (2013.01); *E21B 41/0085* (2013.01); *E21B 43/127* (2013.01); *H01L 41/125* (2013.01)

(58) Field of Classification Search
CPC ................................. F03B 13/02; H02N 2/18
USPC ........................................................ 290/1 R
See application file for complete search history.

(56) References Cited

U.S. PATENT DOCUMENTS

| | | | | |
|---|---|---|---|---|
| 6,504,258 B2* | 1/2003 | Schultz | ................... | E21B 28/00 290/1 R |
| 2002/0121844 A1* | 9/2002 | Ghandi | ..................... | H02N 2/18 310/339 |
| 2005/0230973 A1* | 10/2005 | Fripp | .................. | E21B 41/0085 290/1 R |
| 2005/0230974 A1* | 10/2005 | Masters | .............. | E21B 41/0085 290/1 R |
| 2012/0228875 A1* | 9/2012 | Hardin, Jr. | .......... | E21B 41/0085 290/52 |
| 2012/0228882 A1* | 9/2012 | Dirksen | .............. | E21B 41/0085 290/1 R |
| 2012/0326536 A1* | 12/2012 | Nair | ...................... | H01L 41/125 310/26 |
| 2013/0343918 A1* | 12/2013 | Fripp | .................... | F04B 17/042 417/53 |
| 2014/0009007 A1* | 1/2014 | Murphree | ............. | H01L 41/125 310/26 |
| 2014/0239745 A1* | 8/2014 | Nair | ...................... | H01L 41/125 310/20 |

* cited by examiner

*Primary Examiner* — Joseph Waks
(74) *Attorney, Agent, or Firm* — Jeffrey T. Holman

(57) ABSTRACT

A device for generating electrical energy from mechanical motion includes a magnetostrictive generator configured to be mechanically coupled to a power conveyance path in a well bore. The power conveyance path is configured to experience an axial force change, and the magnetostrictive generator includes at least one magnetostrictive element that experiences a corresponding force change that results in a change in magnetic permeability in the at least one magnetostrictive element resulting, and is configured to experience a change in magnetic flux in a least one component that is electromagnetically coupled to at least one conductive coil, and the conductive coil is configured to generate electricity due to these magnetic flux changes.

18 Claims, 13 Drawing Sheets

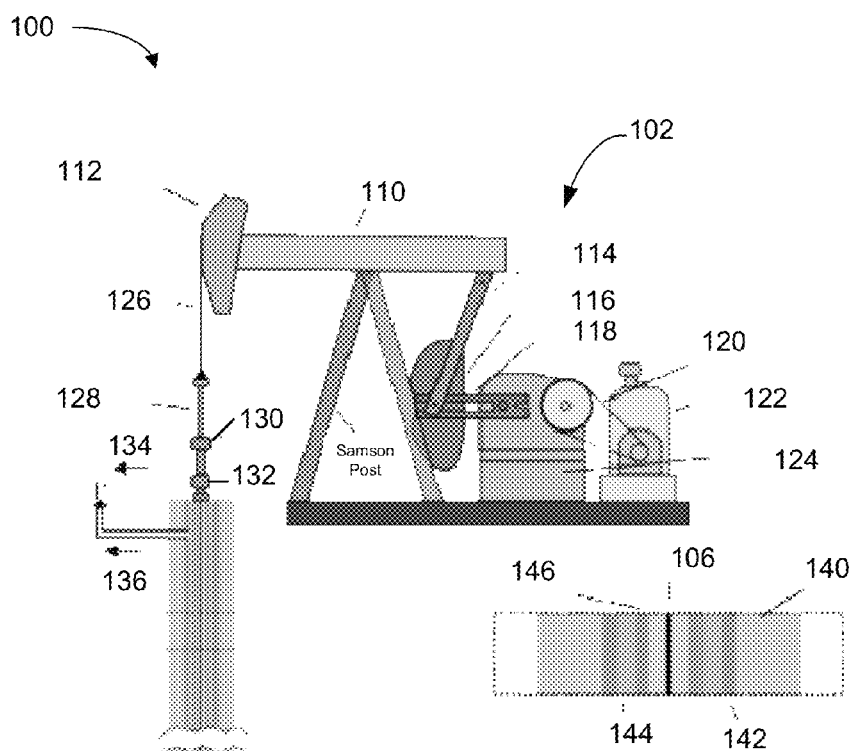
FIG. 1
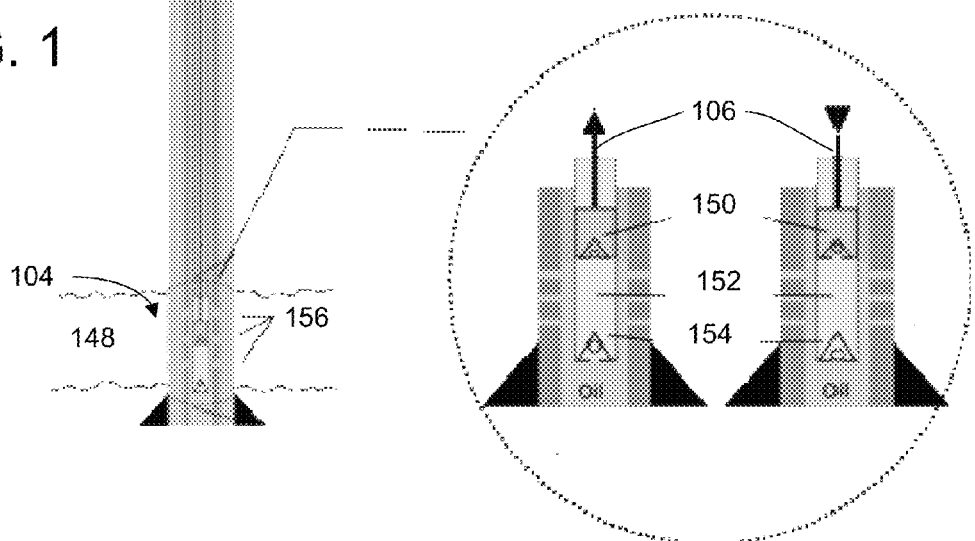

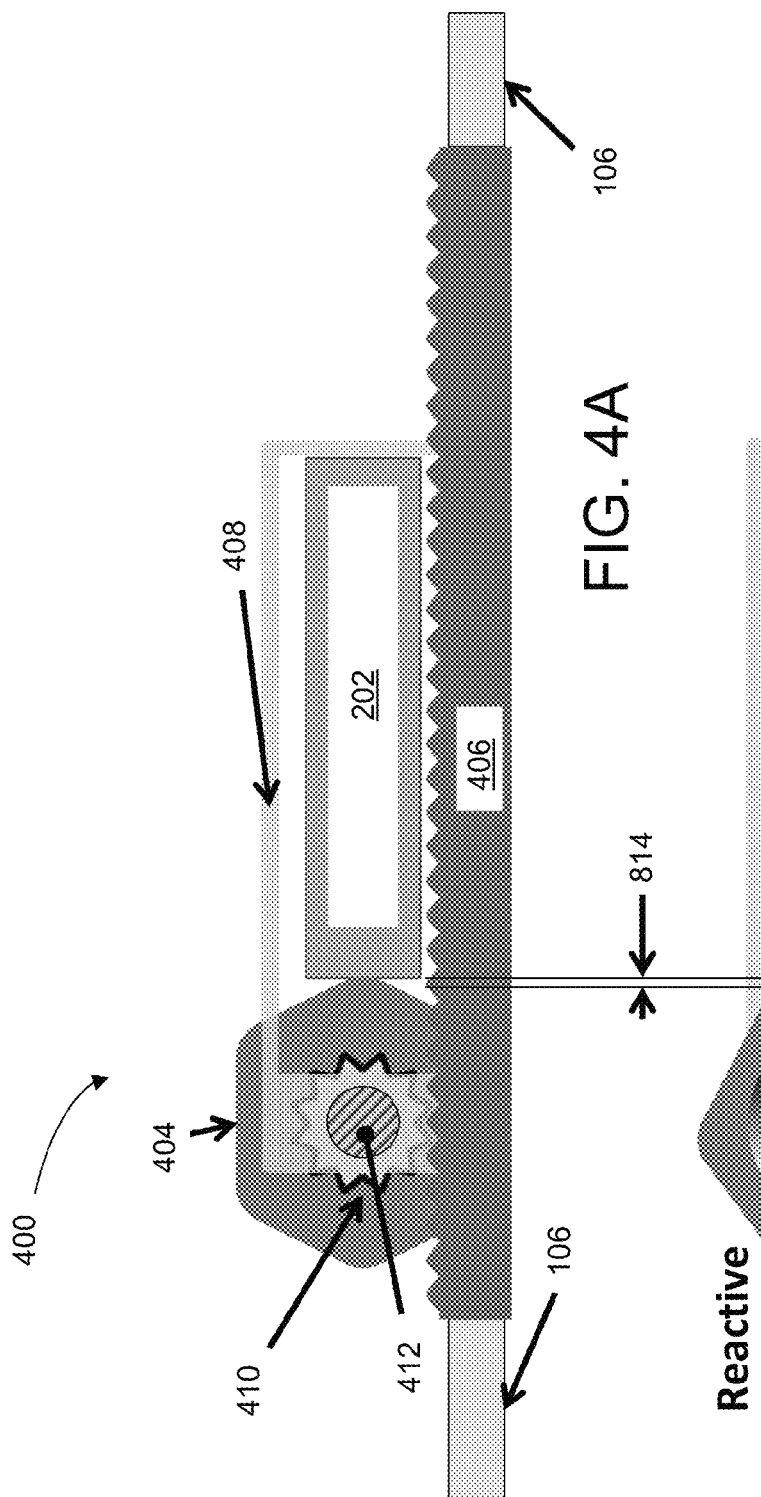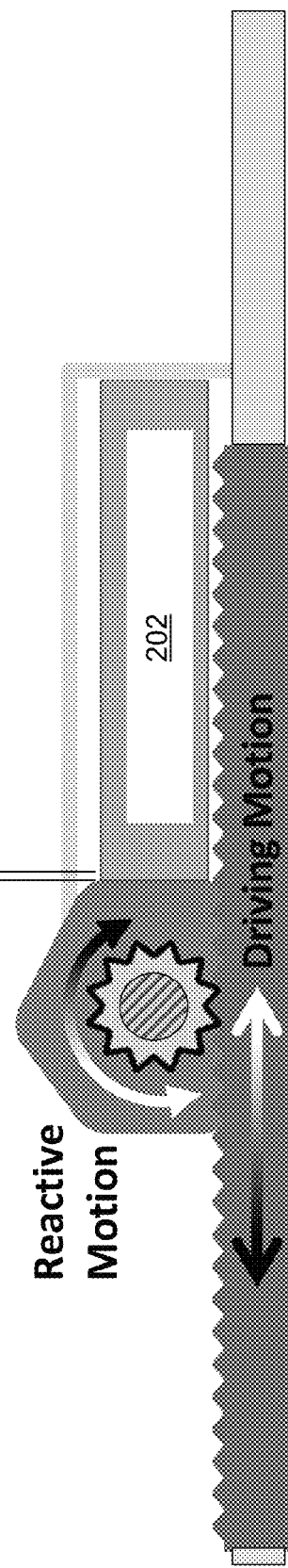
FIG. 4A
FIG. 4B

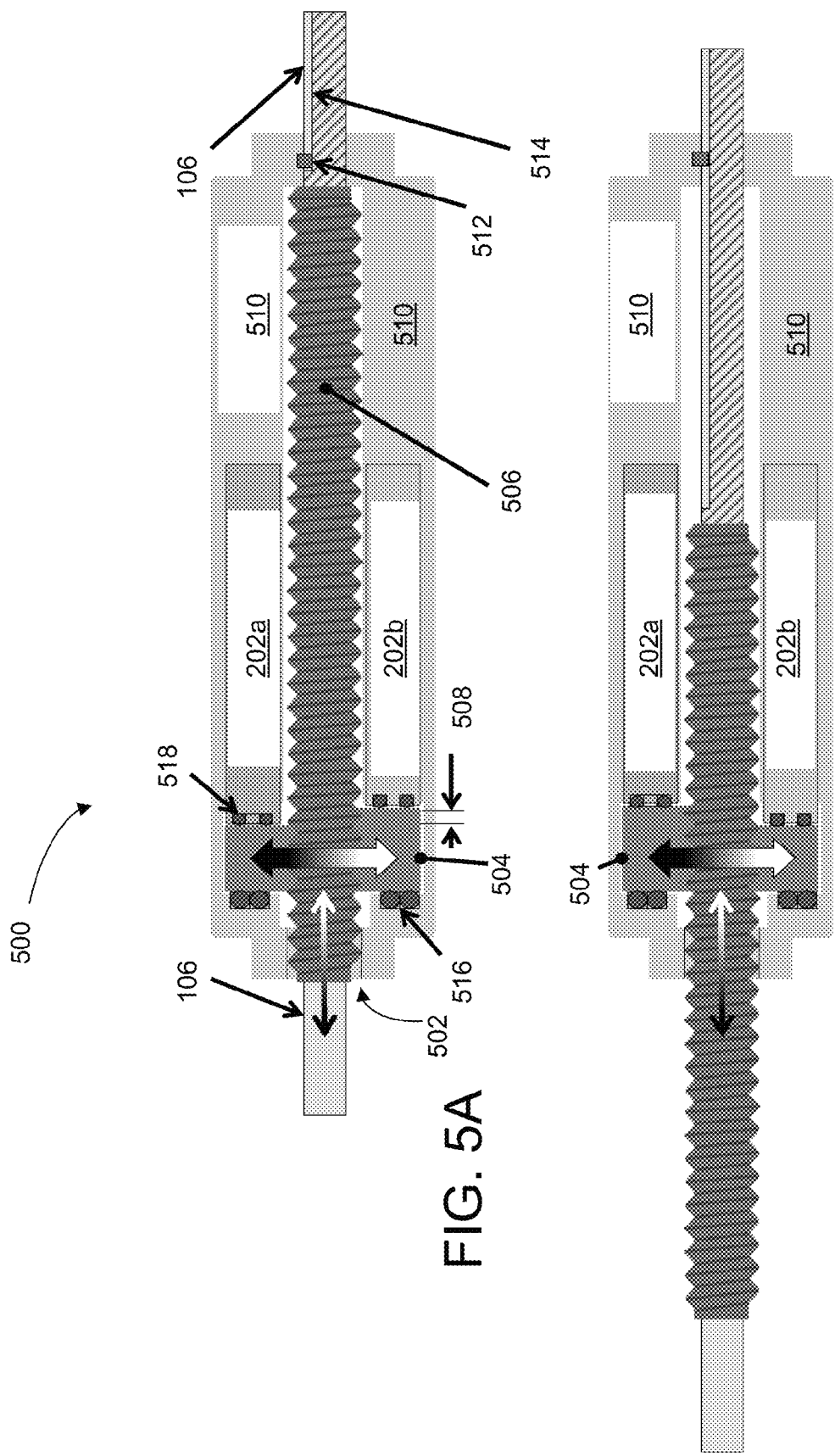

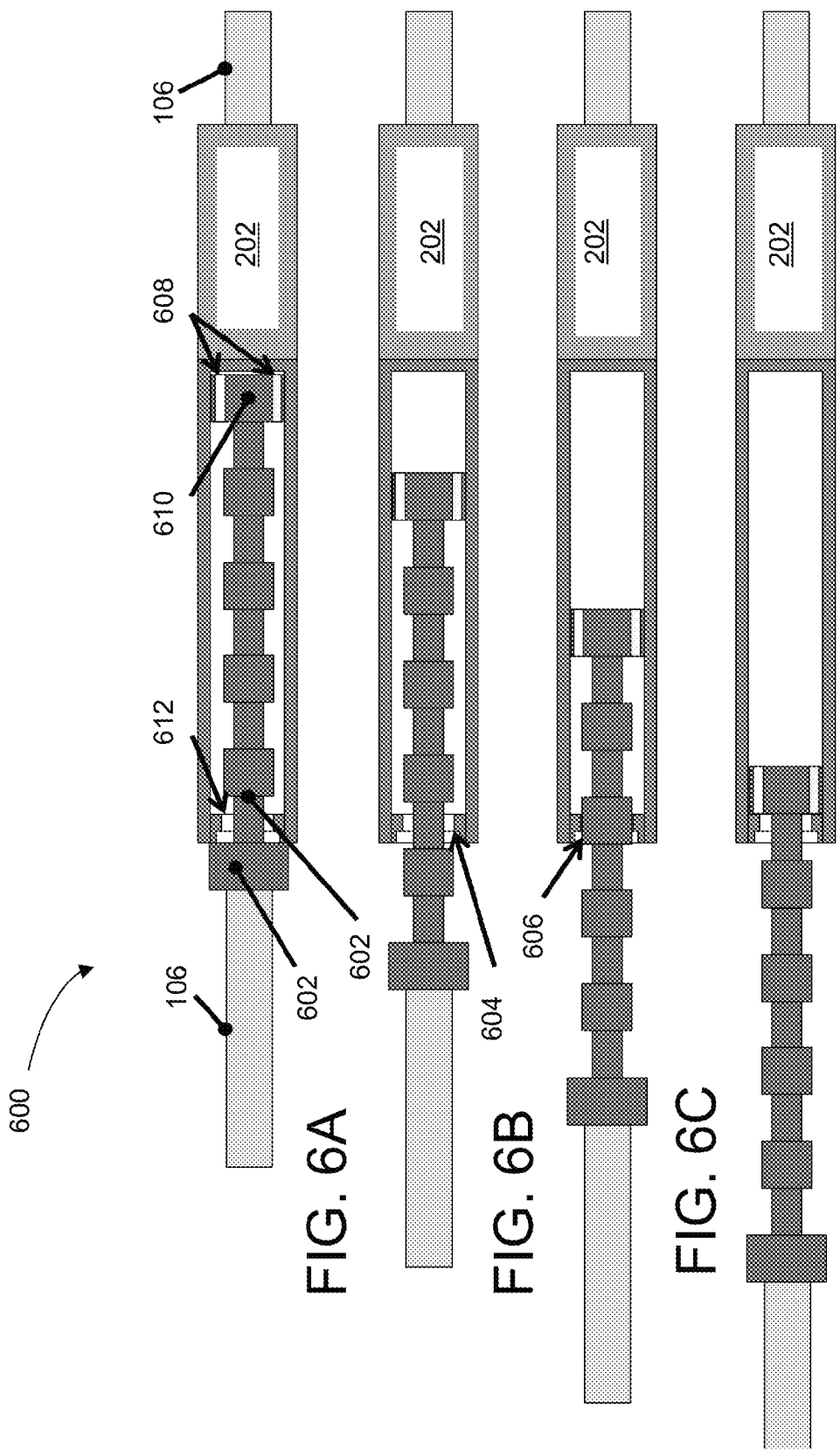

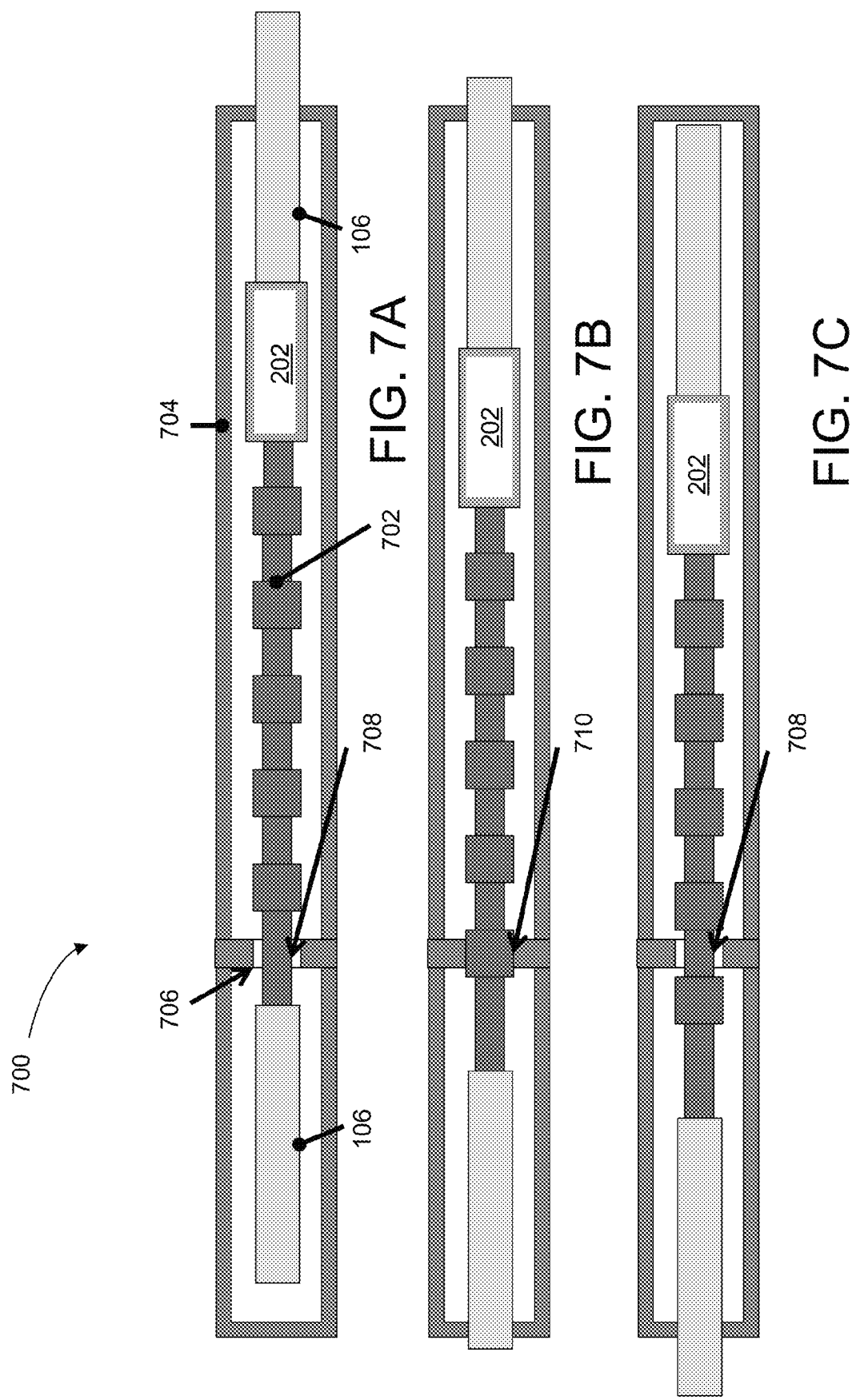

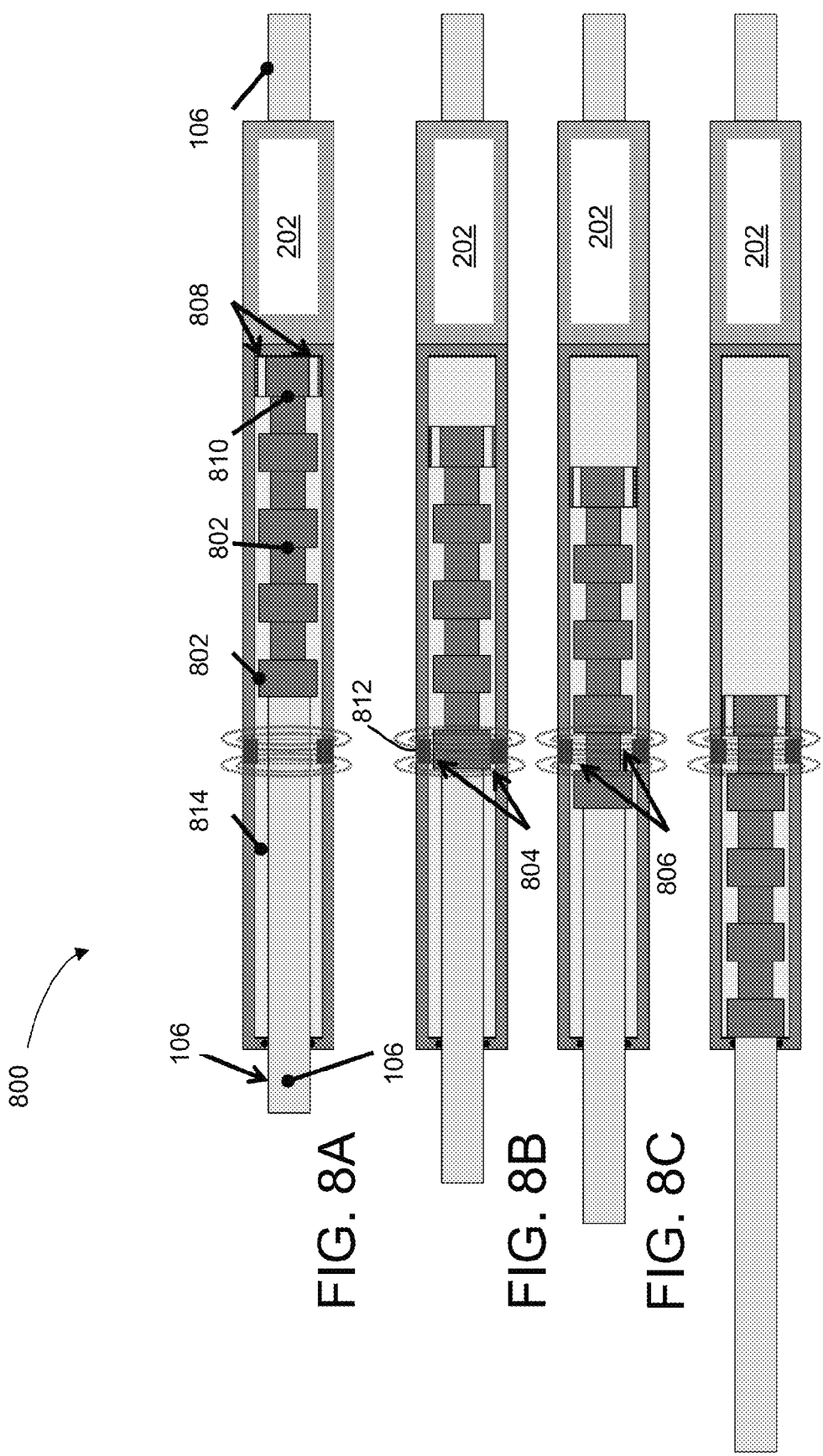

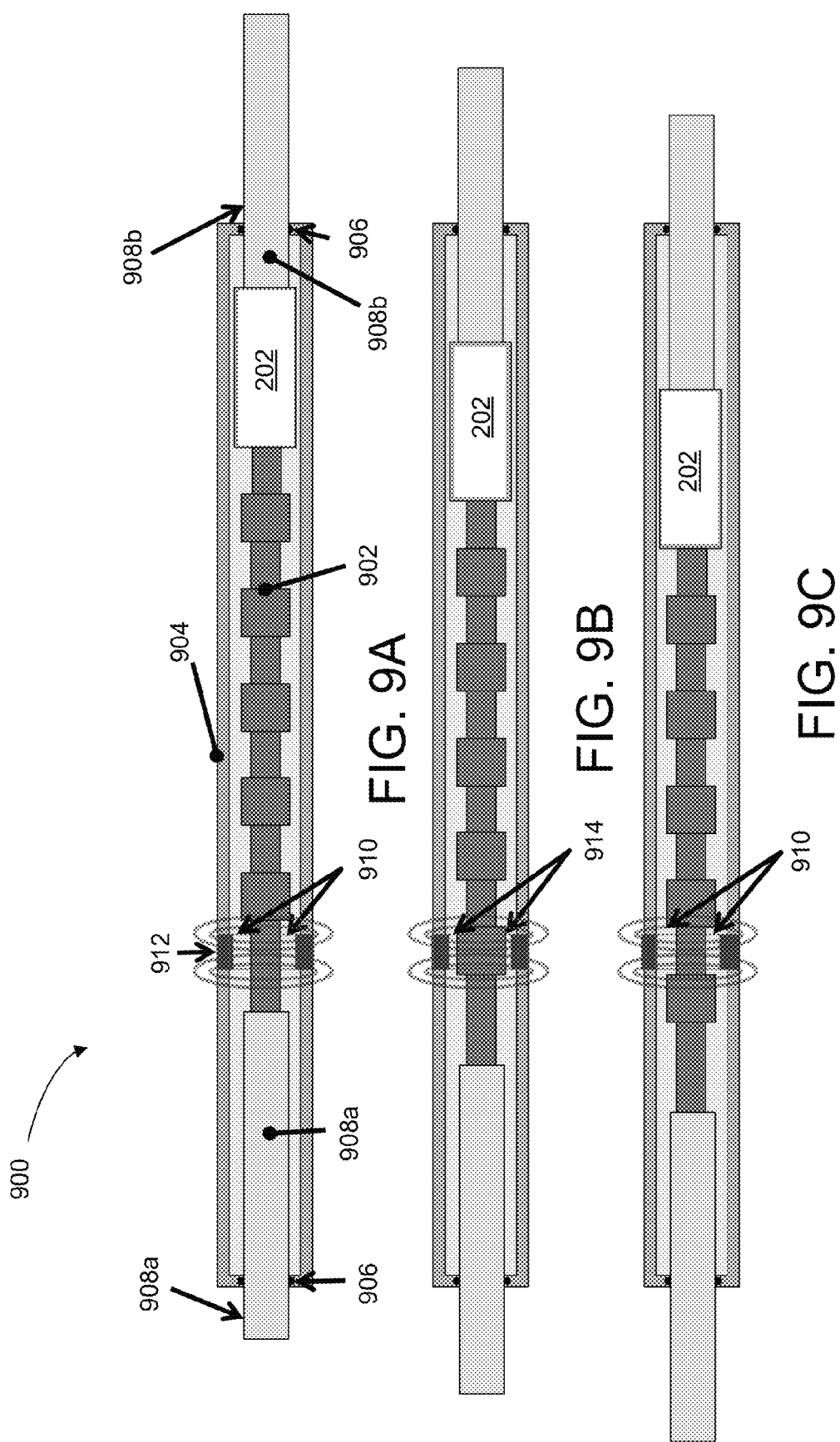

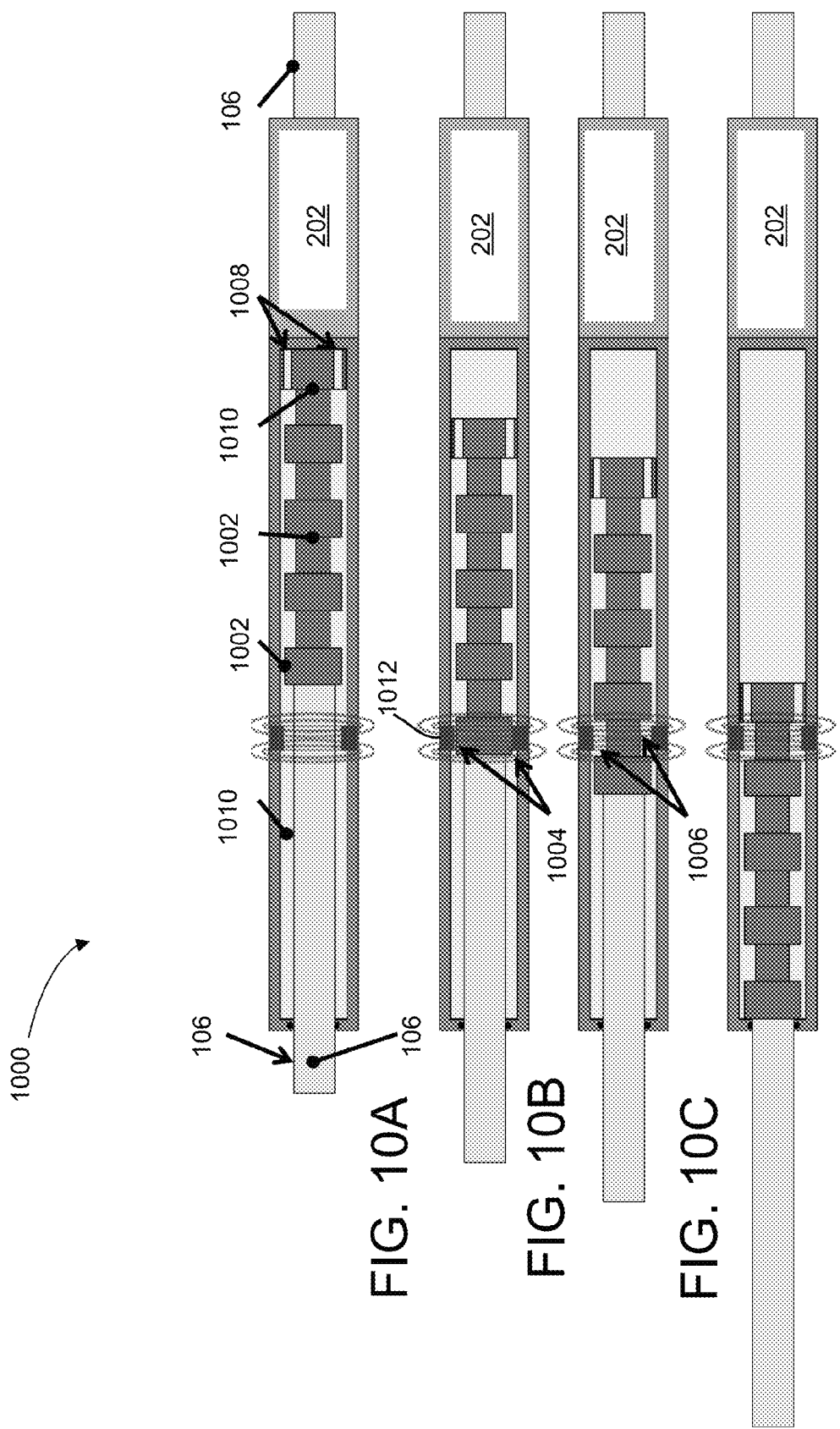

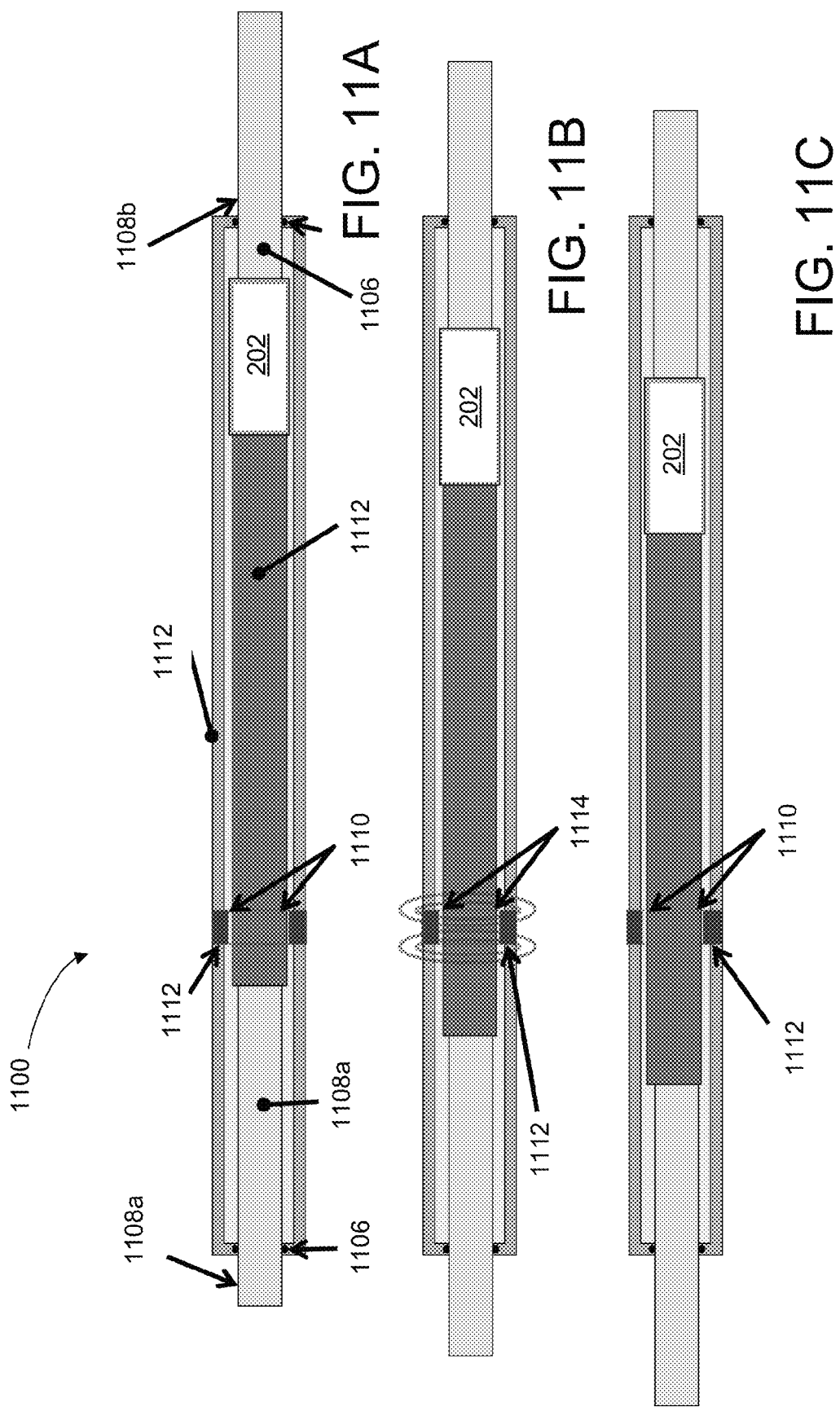

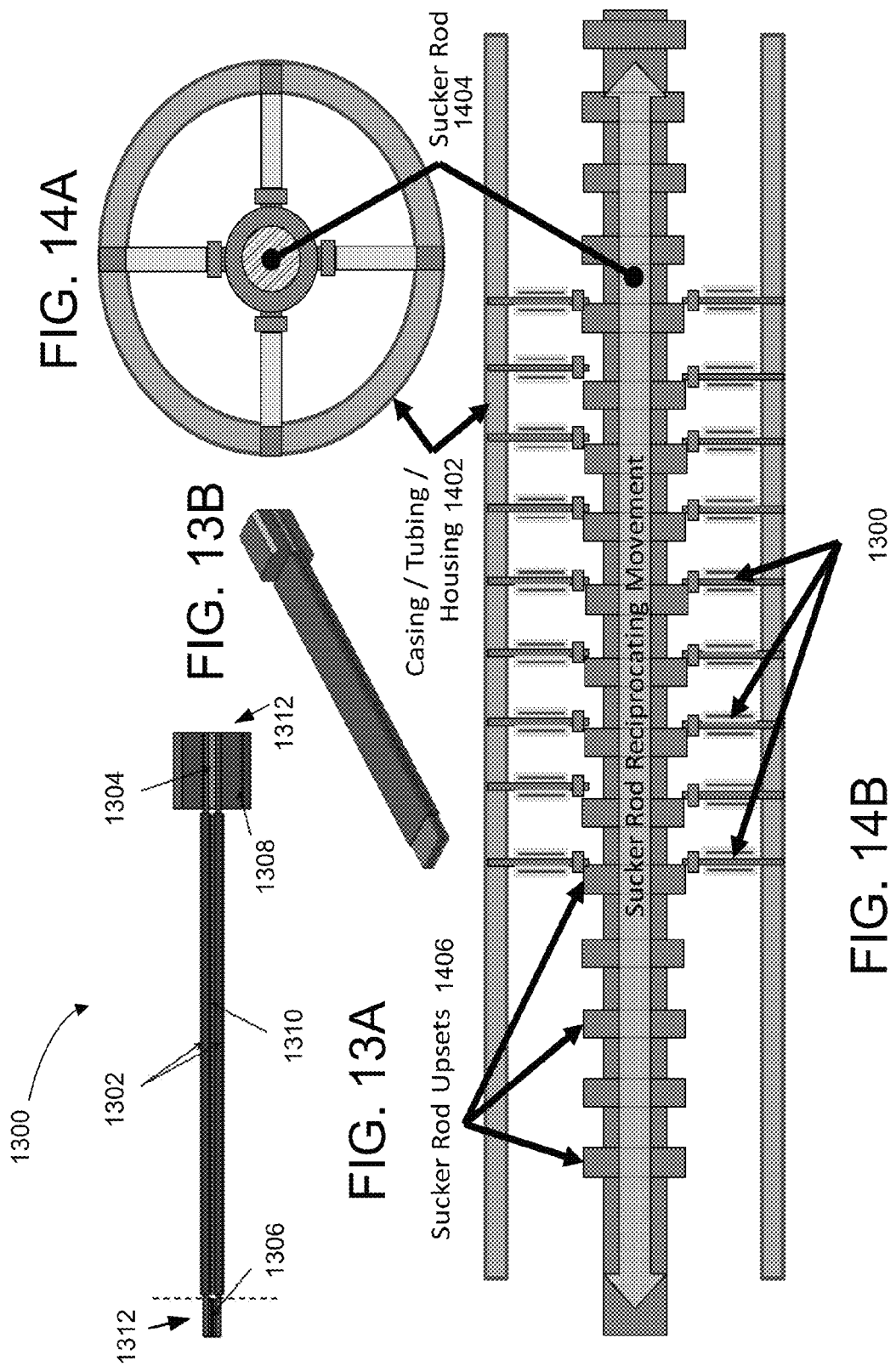

POWER PRODUCTION IN A COMPLETED WELL USING MAGNETOSTRICTIVE MATERIALS

CROSS-REFERENCE TO RELATED APPLICATIONS

This application claims the benefit of U.S. Provisional Application No. 61/900,679, filed on Nov. 6, 2013, which is incorporated by reference herein in its entirety.

BACKGROUND

There are conventional processes of drilling a hole for a well and lining the drilled hole with casing. Similarly, there are conventional processes for perforating and completing a well.

Many wells produce fluids (e.g., oil or water) by using artificial lift to force (i.e., pump) the fluids from the bottom of the well to the surface. Mechanical pumps are often used to provide the artificial lift. The mechanical pump is located at or near the bottom of the well bore. There are different methods to drive the downhole pumps, including by supplying electricity from the surface or mechanically driving the pump from the surface.

SUMMARY

Embodiments of a device for generating electrical energy from mechanical motion are described. In one embodiment, the device includes a magnetostrictive generator configured to be mechanically coupled to a power conveyance path in a well bore. The power conveyance path is configured to experience an axial force change, and the magnetostrictive generator includes at least one magnetostrictive element that experiences a corresponding force change that results in a change in magnetic permeability in the at least one magnetostrictive element resulting, and is configured to experience a change in magnetic flux in a least one component that is electromagnetically coupled to at least one conductive coil, and the conductive coil is configured to generate electricity due to these magnetic flux changes. Other embodiments of the device are also described.

Embodiments of a system for generating electrical energy from mechanical motion are also described. In one embodiment, the system includes a well bore, a plurality of parallel power conveyance paths within the well bore from a pump jack to a downhole pump, and a magnetostrictive generator configured to one of the plurality of parallel power conveyance paths, wherein the one of the plurality of parallel power conveyance paths is configured to experience an axial force, and wherein the magnetostrictive generator is configured to generate electricity from magnetostriction based on the axial force experienced by the one of the plurality of parallel power conveyance paths. Other embodiments of the apparatus are also described. Embodiments of a method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 1 depicts one embodiment of a device for generating electrical energy from mechanical motion.

FIGS. 4A-4B depict one embodiment of a rack and pinion period multiplier and a magnetostrictive generator depicting the cam in a first position and second position.

FIGS. 5A-5B depict one embodiment of an inline/parallel screw-drive period multiplier and magnetostrictive generator depicting the cam plate in a first position and a second position.

FIGS. 6A-6D depict one embodiment of an inline choked dog-bone period multiplier and magnetostrictive generator depicting the dog bone shaft in various positions.

FIGS. 7A-7C depict one embodiment of a choked dog-bone period multiplier and magnetostrictive generator depicting the dog bone shaft in various positions.

FIGS. 8A-8D depict one embodiment of an inline permanent magneto-rheological dog-bone period multiplier depicting the dog bone shaft in various positions.

FIGS. 9A-9C depict one embodiment of a permanent magneto-rheological dog-bone period multiplier and magnetostrictive generator depicting the dog bone shaft in various positions.

FIGS. 10A-10D depict one embodiment of an inline electro-magnet magneto-rheological period multiplier and magnetostrictive generator depicting the dog bone shaft in various positions.

FIGS. 11A-11C depict one embodiment of a parallel electro-magnet magneto-rheological period multiplier and magnetostrictive generator.

FIGS. 13A-13B depict one embodiment of a bar including magnetostrictive elements that can be fastened to a downhole housing.

FIGS. 14A-14B depict one embodiment of the bars of FIGS. 13A-13B in the position on a housing.

Throughout the description, similar reference numbers may be used to identify similar elements.

DETAILED DESCRIPTION

Figure 2:
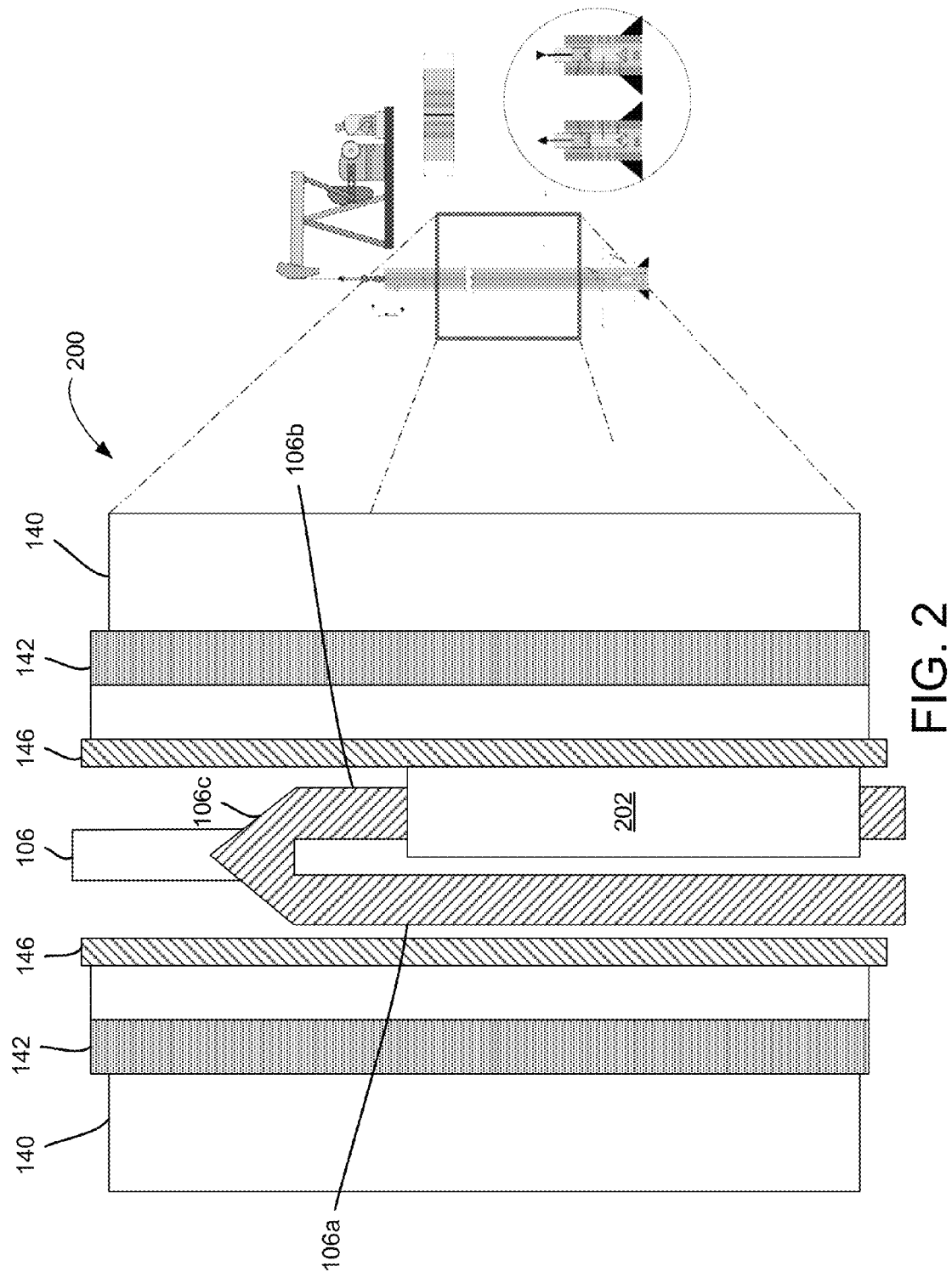
FIG. 2 depicts one embodiment of a magnetostrictive power take-off unit added to a sucker rod and in parallel to a primary sucker rod.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments relate to power production in a completed well using a magnetostrictive generator (s). In general, the invention employs magnetostrictive elements to derive power from mechanical displacement.

There are processes of drilling a hole for a well and lining the drilled hole with casing. Similarly, there are processes for perforating and completing a well.

Many wells produce fluids (e.g., oil or water) by using artificial lift to force (i.e., pump) the fluids from the bottom of the well to the surface. Mechanical pumps are often used to provide the artificial lift. The mechanical pump may be located at or near the bottom of the well bore.

There are different methods to drive the downhole pumps. One method includes supplying electricity from the surface to an electrical submersible pump (ESP). This method may require an electrical cable deployed from the surface and down the well bore.

Another method to drive the downhole pump includes mechanically driving the pump from the surface via one or more sucker rods in series to provide reciprocating motion at the downhole pump. The sucker rod provides a mechanical link between surface components and the downhole pump. A pumpjack or other driving mechanism provides a driving force on the downhole pump to reciprocate the pump within the well bore and force product out of the well.

Many wells are understood to only utilize a single path of power conveyance with a single power take off unit. In many cases, either an electrical cable or a series of sucker rods is used to implement this single path of power conveyance. Embodiments described herein cover the use of parallel power conveyance paths, which may take the form of an electrical cable in combination with a series of sucker rods, a plurality of parallel sucker rods (or sucker rods in series), or a plurality of parallel sucker rods (or sucker rods in series) in combination with an electrical cable. Other embodiments may include two or more electrical cables. In other embodiments, a plurality of power take offs may be implemented in series with a single power conveyance path. Further embodiments may include multiple power take offs from the electrical cable(s) by splitting off the conductors and using parallel wires and/or transformer coupling or other appropriate methods that are publicly available.

Embodiments described herein are directed to coupling magnetostrictive elements to the sucker rods or other components within the pump drive system. In some embodiments, one or more magnetostrictive generator(s) (i.e., power take off(s)) that are arranged in series and/or parallel to the reciprocating sucker rods to experience tension and/or compression as the sucker rods are forced up and down by the pumpjack. Tension and/or compression of the magnetostrictive generators produces magnetic flux which generates electrical current in a nearby conductive coil. The electrical power generated downhole may be used to supply power for downhole use in a production well.

In further embodiments, it may be possible to power a primary mover such as an ESP, or a plurality of ESPs, using power generated downhole by one or more magnetostrictive generators. This type of arrangement may eliminate the need to run an electrical cable down the well bore to direct multiple fluid paths to the surface or downhole to devices such as a gas separator, oil/water separator, downhole sensors, or for re-injection into the well, downhole heaters, and/or powering electronics, processors, sensors and control devices.

In some embodiments, the stress levels and periods imposed on a succor rod or related driving mechanism are well defined and controlled. In some embodiments, the generation of power downhole by one or more magnetostrictive generator may facilitate adjusting and/or optimizing the stress levels and periods experienced by the sucker rods. In further embodiments which implement parallel sucker rods, each sucker rod may be driven at a distinct frequency or at the same frequency as one or more of the other sucker rods. Embodiments of this arrangement may be useful to account for magnetostrictive generators that produce more power higher frequencies compared to artificial lift pumps that have a relatively low drive frequency.

Examples of various types of magnetostrictive generators, or features thereof, are publicly available. The appended figures and description illustrate various embodiments of magnetostrictive generators capable of producing electrical energy from stresses imposed by a motor drive system for a downhole pump.

FIG. 1 depicts one embodiment of a device for generating electrical energy from mechanical motion 100. Although the device 100 is shown and described with certain components and functionality, other embodiments of the device 100 may include fewer or more components to implement less or more functionality.

The illustrated embodiment includes a pump jack 102 and downhole pump 104 with a sucker rod 106 connecting the pump jack 102 and downhole pump 104. The pump jack 102 may include many components, visible from above ground, that drive the downhole pump 104, including a samson post 108, walking beam 110, horse head 112, pitman arm 114, counter weight, 116, crank 118, V-belt 120, prime mover 122, gear reducer 124, bridle 126, polishing rod 128, stuffing box 130, tee 132, an output for oil 134, and an output for gas 136. Although the pump jack 102 is illustrated with certain components other surface units that mechanically drive a downhole pump 104 are envisioned. A breakout view 138 of the borehole components is illustrated, including cement 140 holding the borehole, casing 142, annulus 144, tubing 146, and sucker rod 106. At the bottom of the well in the oil bearing zone 148 is the downhole pump 104 connected to the sucker rod 106. The downhole pump may include a traveling valve 150, a pump barrel 152, and a standing valve 154. The casing 142 and cement 140 may have perforations 156.

FIG. 2 depicts a schematic diagram of one embodiment illustrating a breakout view 200 of the device 100 of FIG. 1 with a magnetostrictive power take-off unit 202 added to a sucker rod 106b and in parallel to a primary sucker rod 106a. Although shown and described with certain components and functionality, other embodiments may include fewer or more components to implement less or more functionality.

The illustrated embodiment depicts a sucker rod 106 mating with a sucker rod splitter 106c. The sucker rod splitter 106c splits the single power conveyance path into two parallel power conveyance paths. The power conveyance path runs from the pump jack 102 at the surface of the well to the downhole pump 104 at the bottom of the well. The sucker rod splitter 106c splits into a primary sucker rod 106a and a secondary sucker rod 106b. In the illustrated embodiment, a magnetostrictive generator 202 or magnetostrictive power take-off unit is attached to the secondary sucker rod 106b. A magnetostrictive power take-off unit or generator 202 may include a magnetostrictive element and an electrically conductive coil (not specifically shown). The magnetostrictive element may experience stress in response to movement of the sucker rod. The electrically conductive coil may be disposed in proximity to the magneto strictive element. The electrically conductive coil may be configured to generate an electrical current in response to a change in flux density of the magnetostrictive element. In some embodiments, the pump jack 102 generates sinusoidal movement of the sucker rod 106, which may generate an axial force on the sucker rod 106. The change in axial force and stress drives the magnetostriction of the magnetostrictive generator 202. In some embodiments, the magnetostrictive generator 202 is anchored to the tubing 146 or other casing 142. The movement of the sucker rod 106 may be used to generate stress on the anchored magnetostrictive generator 202.

Figure 3:
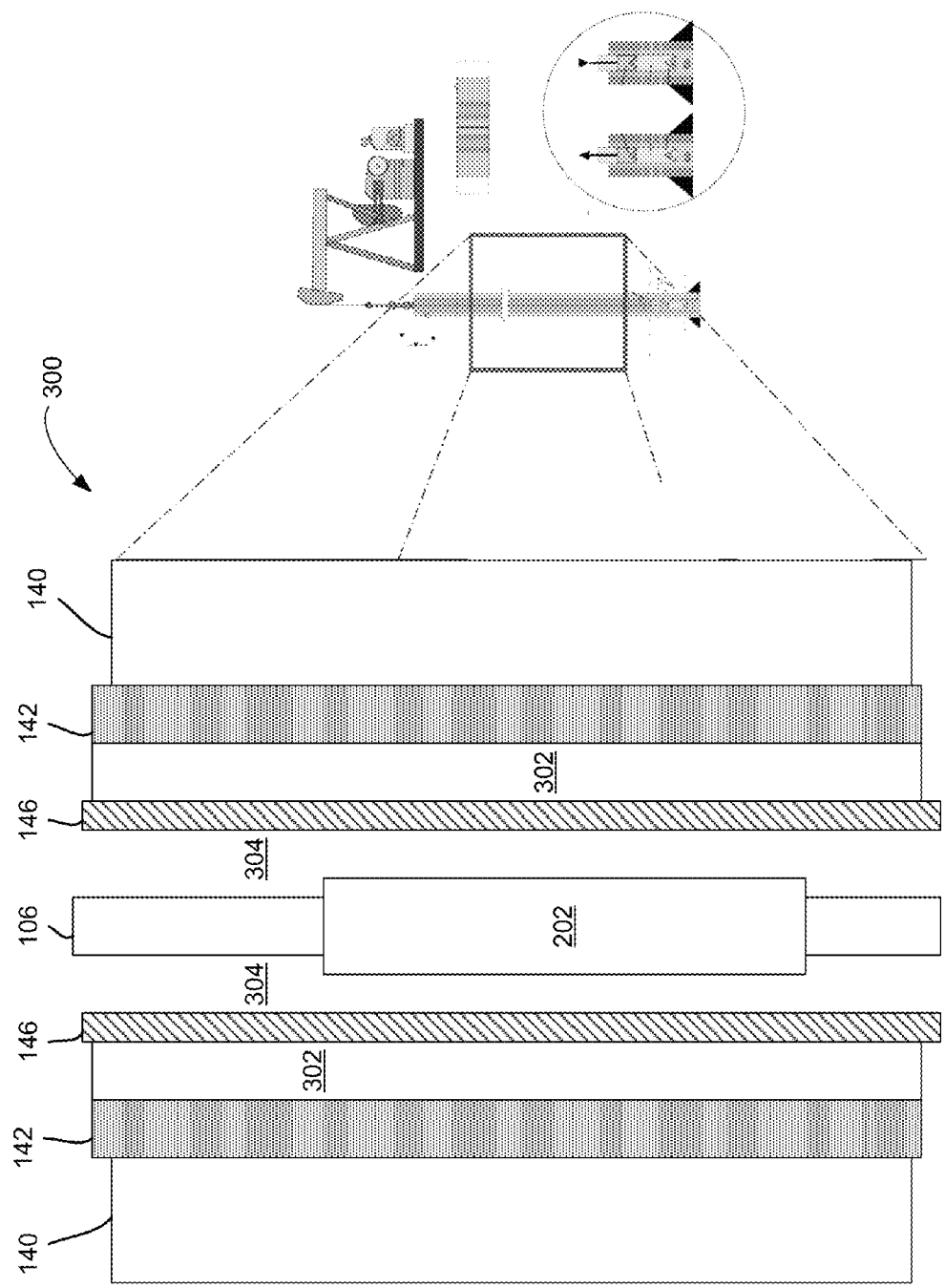
FIG. 3 depicts one embodiment of an inline magnetostrictive power take-off unit added to a sucker rod.

FIG. 3 depicts one embodiment of an inline magnetostrictive power take-off unit or magnetostrictive generator 202 added to a sucker rod 106. The illustrated embodiment also depicts an annulus for the completion fluid 302 and an annulus for the production fluid 304. In the illustrated embodiment, the magnetostrictive generator 202 is added in series with the sucker rod 106. In some embodiments, the magnetostrictive generator 202 is anchored to the casing 142 or tubing 146. In some embodiments, the magnetostrictive generator 202 is anchored or tethered to the downhole pump 104.

FIGS. 4A-4B depict one embodiment of a force modification unit 400 including a rack and pinion period multiplier 402 and a magnetostrictive generator 202 depicting a cam 404 in a first position shown in FIG. 4A and second position shown in FIG. 4B. In the illustrated embodiment, a rack 406 is attached or coupled to the sucker rod 106 or a cable. The illustrated embodiment further includes a magnetostrictive generator 202 disposed within a cage 408. The cage 408 may be attached to the casing 142 or tubing 146. In some embodiments, the cage 408 is attached or tethered to the downhole pump 104 or another anchor. The illustrated embodiment further includes a pinion 410 on an axle 412 in mechanical communication with the rack 406. As the sucker rod 106 or cable moves up and down, the rack 406 causes the pinion 410 to rotate and drive the cam 404. The cam 404 may be a single or multi lobe cam. As the cam 404 rotates, an axial force is exerted on the magnetostrictive generator 202. FIG. 4A shows the cam 404 in a first position. FIG. 4B shows the cam 404 in a second position. The resultant cyclical deflection 412 is shown. A first end of the magnetostrictive generator 202 is restricted in movement by the cage 408 and the second end of the magnetostrictive generator 202 is deflected by the cam 404. Not all possible configurations are depicted and many different configurations of a rack and pinion or other force modification unit are envisioned.

FIGS. 5A-5B depict one embodiment of a force modification unit 500 including an inline/parallel screw-drive period multiplier 502 and magnetostrictive generator 202 depicting a cam plate 504 in a first position shown in FIG. 5A and a second position shown in FIG. 5B. The illustrated embodiment includes a sucker rod 106 (or cable in other embodiments). The sucker rod 106 is threaded or a threaded rod 504 is added or coupled to the sucker rod 106 or cable. The threaded rod 504 mechanically communicates with cam plate 504 causing the cam plate 504 to rotate as the sucker rod 106 reciprocates. The illustrated embodiment depicts to magnetostrictive generators 202. In FIG. 5A, magnetostrictive generator 202a is relaxed and magnetostrictive generator 202b is compressed. The cyclical deflection 508 is depicted. A first end of the magnetostrictive generator(s) 202 is restricted by a non rotating body 510 while a second end is deflected by the cam plate 504. Other components may be necessary for the functionality of the unit 500 including an anti-rotation pin 512, anti-rotation slot 514, cam bearings 516, and generator bearings 518.

In FIG. 5A, magnetostrictive generator 202a is relaxed and magnetostrictive generator 202b is compressed. FIG. 5B depicts the system after the cam plate 504 has rotated. Magnetostrictive generator 202b is now relaxed and magnetostrictive generator 202a is now compressed. The fluctuation of the compression drives the magnetostrictive process to generate electrical energy.

FIGS. 6A-6D depict one embodiment of an inline choked dog-bone period multiplier 600 and magnetostrictive generator 202 depicting the dog bone shaft 602 in various positions. FIG. 6A depicts the dog bone shaft 602 in a lower stop position 610. FIG. 6B depicts the dog bone shaft 602 in a free flow position showing free flow 604 in the choke hole 612. FIG. 6C depicts the dog bone shaft 602 in a restricted flow position showing restricted flow 606. FIG. 6D depicts the dog bone shaft 602 in an upper stop position. The dog bone shaft 602 may include bypass ports 608 and may be attached or otherwise coupled to the sucker rod 106 (or cable). The illustrated embodiment also includes the magnetostrictive generator 202. The flow cycles between restricted flow 606 (higher downward and/or upward force) and free flow 604 (lesser downward and/or upward force). Full downward force is achieved in the lower stop position shown in FIG. 6A. Full upward force is achieved in the upper stop position shown in FIG. 6D.

FIGS. 7A-7C depict one embodiment of a choked dog-bone period multiplier 700 and magnetostrictive generator 202 depicting a dog bone shaft 702 in various positions. In the illustrated embodiment, a dog bone shaft 702 is attached or otherwise coupled to a sucker rod 106 (or cable) and a magnetostrictive generator 202 is placed in series with the sucker rod 106 and dog bone shaft 702. The dog bone shaft 702 may be in a casing or tubing 704 or in an open bore hole. FIG. 7A shows an open hole choke 706 and allows free flow 708 (lower force). FIG. 7B shows restricted flow 710 (higher force). FIG. 7C shows free flow 708 repeated.

FIGS. 8A-8D depict one embodiment of an inline permanent magneto-rheological dog-bone period multiplier 800 depicting a dog bone shaft 802 in various positions. FIG. 8A depicts the dog bone shaft 802 in a lower stop position 810. FIG. 8B depicts the dog bone shaft 802 in a restricted flow position showing restricted flow 804. FIG. 8C depicts the dog bone shaft 802 in a free flow position showing free flow 806. FIG. 8D depicts the dog bone shaft 802 in an upper stop position. The dog bone shaft 802 may include bypass ports 808 and may be attached or otherwise coupled to the sucker rod 106 (or cable). The illustrated embodiment also includes the magnetostrictive generator 202. The flow cycles between restricted flow 804 (higher downward and/or upward force) and free flow 806 (lesser downward and/or upward force). Full downward force is achieved in the lower stop position 810 shown in FIG. 8A. Full upward force is achieved in the upper stop position shown in FIG. 8D. The illustrated embodiment further includes a permanent magnet 812 and magnetorheological fluid 814 that affect the forces exerted on the magnetostrictive generator 202.

FIGS. 9A-9C depict one embodiment of a permanent magneto-rheological dog-bone period multiplier 900 and magnetostrictive generator 202 depicting a dog bone shaft 902 in various positions. In the illustrated embodiment, the dog bone shaft 902 is encased in a housing 904 with seals 906 to allow polished rods 908a and 908b to reciprocate. Polished rod 908a may lead to and be attached to a sucker rod 106 (or cable). Polished rod 908b may lead to the downhole pump 104 or an anchor. The illustrated embodiment also includes a permanent magnet 912. FIGS. 9A and 9C show free flow 910 (lower force). FIG. 9B shows restricted flow 914 (higher force) enhanced by the viscosity of the fluid. As the rods 908 reciprocate the magnetostrictive generator 202 receives varying axial forces.

FIGS. 10A-10D depict one embodiment of an inline electro-magnet magneto-rheological period multiplier 1000 and magnetostrictive generator 202 depicting a dog bone shaft 1002 in various positions. FIG. 10A depicts the dog bone shaft 1002 in a lower stop position 1010. FIG. 10B depicts the dog bone shaft 1002 in a restricted flow position showing restricted flow 1004 in the choke hole. FIG. 10C depicts the dog bone shaft 1002 in a free flow position showing free flow 1006. FIG. 10D depicts the dog bone shaft 1002 in an upper stop position. The dog bone shaft 1002 may include bypass ports 1008 and may be attached or otherwise coupled to the sucker rod 106 (or cable). The illustrated embodiment also includes the magnetostrictive generator 202 and a permanent magnet 1012. The flow cycles between restricted flow 1004 (higher downward and/or upward force) and free flow 1006 (lesser downward and/or upward force). Full downward force is achieved in the lower stop position shown in FIG. 10A. Full upward force is achieved in the upper stop position shown in FIG. 10D. FIG. 10B shows restricted flow 1004 (higher force) enhanced by the viscosity of the magnetorheological fluid 1010.

FIGS. 11A-11C depict one embodiment of a parallel electro-magnet magneto-rheological period multiplier 1100 and a magnetostrictive generator 202. In the illustrated embodiment, the drive shaft 1102 is encased in a housing 1104 with seals 1106 to allow polished rods 1108a and 1108b to reciprocate. Polished rod 1108a may lead to and be attached to a sucker rod 106 (or cable). Polished rod 1108b may lead to the downhole pump 104 or an anchor. The illustrated embodiment also includes an electro-magnet 1112. FIGS. 11A and 11C show free flow 1110 (lower force) with the electro-magnet 1112 unpowered. FIG. 11B shows restricted flow 1114 (higher force) enhanced by the viscosity of the fluid and the powered electro-magnet 1112. As the rods 1108 reciprocate the magnetostrictive generator 202 receives varying axial forces.

Figure 12:
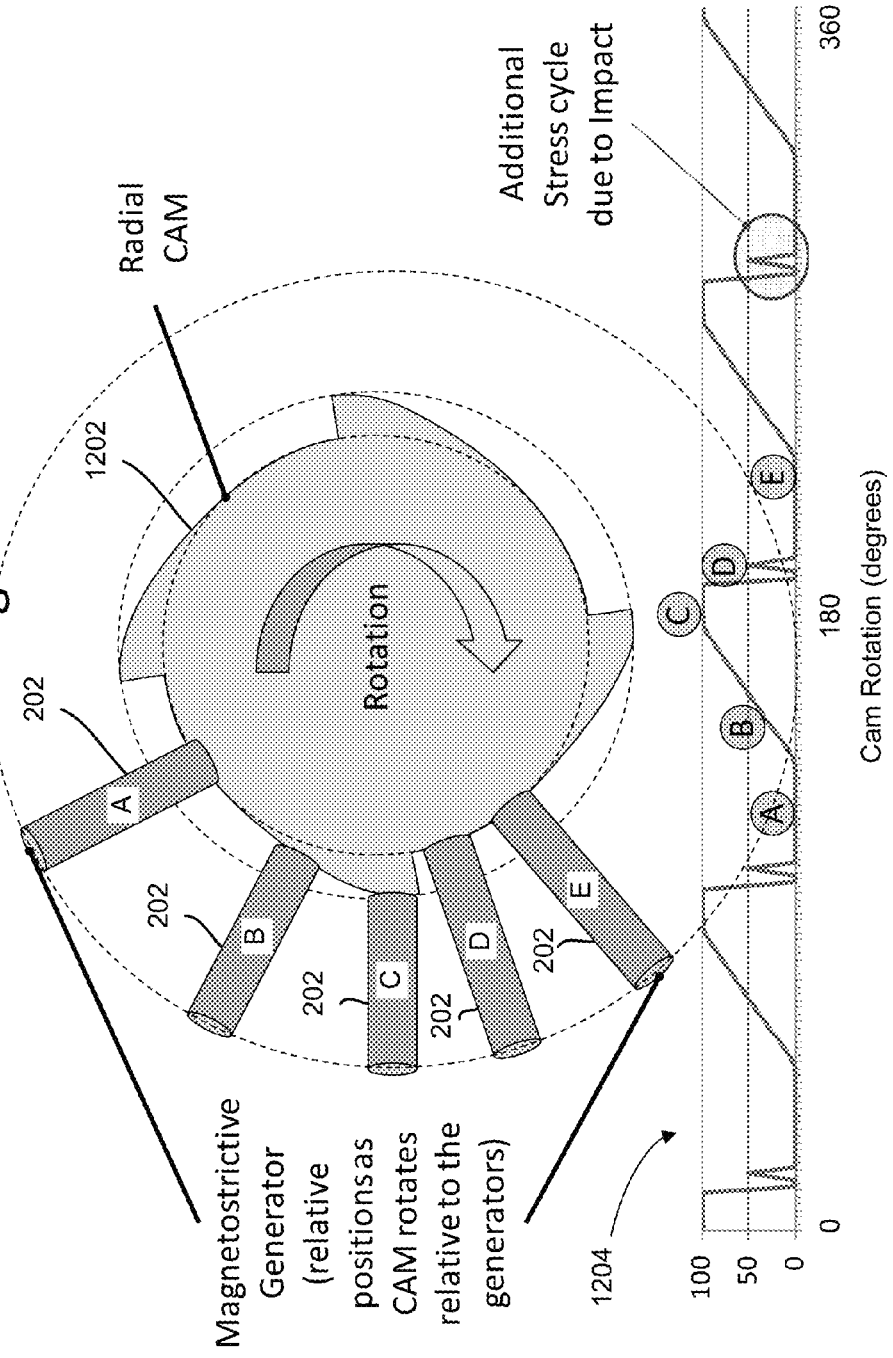
FIG. 12 depicts one embodiment of rotating 4 lobe cam profile generating stress on a magnetostrictive generator.

FIG. 12 depicts one embodiment of rotating four lobe radial cam 1202 generating stress on a magnetostrictive generator 202. A single magnetostrictive generator 202 is shown in 5 different positions (A-E) in relation to the radial cam 1202. Each relative position causes a different stress on the magnetostrictive generator as the radial cam 1202 rotates. The percentage of maximum stress is shown 1204 in relation to the radial cam rotation.

FIGS. 13A-13B depict one embodiment of a bar 1300 including magnetostrictive elements and coils 1302 with a gap 1310. The illustrated embodiment also includes a magnetically permeable material 1304, a permanent magnet material 1306, added mass 1308. The bar 1300 may have a first end 1312 that can be fastened or fixed to a downhole housing/casing/tubing (shown in FIGS. 14A-14B) and a second free end 1314. FIG. 13B depicts a perspective view of the bar 1300 of FIG. 13A.

FIGS. 14A-14B depict one embodiment of the bars 1300 of FIGS. 13A-13B in a cantilever position on a housing 1402. The illustrated embodiment also includes a sucker rod 1404 with upsets 1406. The sucker rod 1404 reciprocates and engages the free end 1314 of the bars 1300. The cantilevered bars 1300 vibrate at the bar's natural frequency and deflect at the frequency driven by the sucker rod 1404 speed and upset 1406 spacing.

Many of the illustrated embodiments involving a sucker rod may also be practiced on cables (including steel, electrical, etc.). The power conveyance path may also be any means of conveying power from the surface of a well to the bottom of the well, including the sucker rods and cables discussed herein.

Utilizing a magnetostrictive generator to generate electrical power allows for the increased power in downhole applications where power generation and transmission is inherently difficult. Such increased power may be used to increase efficiencies and increase production rates of wells. A method of using the devices and systems described herein allows for increased hydrocarbon production at a well. Methods may include utilizing power generated from a magnetostrictive generator coupled to a power conveyance path as described herein to increase production of hydrocarbons from a well.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

What is claimed is:

1. A device for generating electrical energy from mechanical motion, the device comprising:
a magnetostrictive generator configured to be mechanically coupled to a power conveyance path in a well bore, wherein the power conveyance path is configured to experience an axial force change, and wherein the magnetostrictive generator comprises at least one magnetostrictive element that experiences a corresponding force change that results in a change in magnetic permeability in the at least one magnetostrictive element resulting, and is configured to experience a change in magnetic flux in a least one component that is electromagnetically coupled to at least one conductive coil, and the conductive coil is configured to generate electricity due to these magnetic flux changes, wherein the axial force comprises multiple discrete step forces generated from a substantially sinusoidal movement of a corresponding pump jack.

2. The device of claim 1, further comprising:
a force modification unit coupled to the power conveyance path, wherein the force modification unit is configured to receive an input force based on a substantially continuous sinusoidal movement of a pump jack and to output multiple discrete fractional movements representative of portions of the input force.

3. The device of claim 2, wherein the force modification unit comprises a rack and pinion period multiplier.

4. The device of claim 2, wherein the force modification unit comprises a screw-drive period multiplier.

5. The device of claim 1, wherein the magnetostrictive generator comprises:
a magnetostrictive element to experience stress in response to movement.

6. The device of claim 1, wherein the magnetostrictive generator is attached to a sucker rod in the power conveyance path.

7. The device of claim 1, further comprising:
a permanent magnet electromagnetically coupled to the at least one magentostrictive element.

8. The device of claim 1, further comprising:
an electro-magnet electromagnetically coupled to the at least one magentostrictive element.

9. A system for generating electrical energy from mechanical motion, the system comprising:
a well bore;
a plurality of parallel power conveyance paths within the well bore; and
a magnetostrictive generator configured to one of the plurality of parallel power conveyance paths,
wherein the one of the plurality of parallel power conveyance paths is configured to experience an axial force change, and
wherein the magnetostrictive generator is configured to generate electricity driven by the axial force changes experienced by the one of the plurality of parallel power conveyance paths.

10. The system of claim 9, wherein the plurality of parallel power conveyance paths comprise an electrical cable and a series of sucker rods.

11. The system of claim 9, wherein the plurality of parallel power conveyance paths comprise a plurality of sucker rods in parallel with one another.

12. The system of claim 11, wherein the plurality of parallel sucker rods are configured to be driven at different frequencies.

13. The system of claim 9, wherein the plurality of parallel power conveyance paths comprise an electrical cable and a plurality of sucker rods, wherein the sucker rods are arranged in parallel with one another.

14. The system of claim 9, wherein the plurality of parallel power conveyance paths comprise a plurality of electrical cable in parallel with one another.

15. The system of claim 9, wherein the plurality of parallel power conveyance paths comprise at least two electrical cables.

16. The system of claim 9, further comprising a plurality of magnetostrictive generators arranged in series with the power conveyance paths.

17. The system of claim 9, further comprising:
a force modification unit coupled to the one of the plurality of parallel power conveyance paths and to the pump jack, wherein the force modification unit is configured to receive an input force based on a substantially continuous sinusoidal movement of the pump jack and to output multiple discrete fractional movements representative of portions of the input force, wherein the force modification unit comprises a rack and pinion period multiplier.

18. The system of claim 9, further comprising:
a force modification unit coupled to the one of the plurality of parallel power conveyance paths and to the pump jack, wherein the force modification unit is configured to receive an input force based on a substantially continuous sinusoidal movement of the pump jack and to output multiple discrete fractional movements representative of portions of the input force, wherein the force modification unit comprises a screw-drive period multiplier.

* * * * *